United States Patent [19]

Selcuk et al.

[11] Patent Number: 4,905,065
[45] Date of Patent: Feb. 27, 1990

[54] HIGH DENSITY DRAM TRENCH CAPACITOR ISOLATION EMPLOYING DOUBLE EPITAXIAL LAYERS

[75] Inventors: Asim A. Selcuk, Santa Clara; Pau-ling Chen, San Jose; Darrell M. Erb, Los Altos, all of Calif.

[73] Assignee: Advanced Micro Devices, Inc., Sunnyvale, Calif.

[21] Appl. No.: 49,194

[22] Filed: May 12, 1987

[51] Int. Cl.$^4$ ............... H01L 29/78; H01L 24/06; H01L 27/02
[52] U.S. Cl. .................... 357/23.6; 357/55; 357/42
[58] Field of Search ............ 357/23.6, 55, 42; 437/919

[56] References Cited

U.S. PATENT DOCUMENTS 4,716,384  8/1988  Neppl et al. ............... 357/42

FOREIGN PATENT DOCUMENTS 128657  7/1985  Japan ............... 357/23.6
140860  7/1985  Japan ............... 357/23.6

OTHER PUBLICATIONS

Sunami et al., "A Corrugated Capacitor Cell for Megabit Dynamic MOS Memories", 1982 IEDM Technical Digest, pp. 806–808 (1982).
Elehy et al., "Trench Capacitor Leakage in Mbit DRAMs", 1984 IEDM Technical Digest, pp. 248–251 (1984).
Sakamoto et al., "Buried Storage Electrode (BSE) Cell for Megabit DRAMs", 1985 IEDM Technical Digest, pp. 710–713 (1985).
Lu et al., "The SPT Cell-A New Substrate-Plate Trench Cell for DRAMs", 1985 IEDM Technical Digest, pp. 771–772 (1985).

Primary Examiner—Rolf Hille
Assistant Examiner—Robert P. Limanek
Attorney, Agent, or Firm—Ashen Golant Martin & Seldon

[57] ABSTRACT

A new double-epitaxial structure for isolating deep (>5 $\mu$m) trench capacitors (10, 10') with 1 $\mu$m or less spacing (S) is disclosed. The structure comprises a thin, lightly doped upper epitaxial layer (16) on top of a thicker and more heavily doped bottom epitaxial layer (14). The low resistivity bottom epitaxial layer is intended to isolate trench capacitors of any depth. The high resistivity upper epitaxial layer is used for the CMOS periphery (22, 24) and can be selectively doped to achieve a near uniform concentration to isolate trench capacitors in the core region (20) surrounding the capacitors. Isolation between deep trenches at 1 $\mu$m spacing has been demonstrated to be applicable for 4 Megabit and greater DRAM integration levels.

14 Claims, 5 Drawing Sheets

HIGH DENSITY DRAM TRENCH CAPACITOR ISOLATION EMPLOYING DOUBLE EPITAXIAL LAYERS

BACKGROUND OF THE INVENTION

1. Field of the Invention

The present invention relates to dynamic random access memories (DRAMs), and, more particularly, to a structure and process for achieving high density DRAMs.

2. Description of the Related Art

A one-transistor dynamic memory cell comprises a pass-gate, storage capacitor and electrical connections to a bit-line, word-line and capacitor plate. The pass-gate is used to access the capacitor for reading and writing the memory cell.

The cell stores the value of a bit (one or zero) by the presence or absence of charge on the storage capacitor. The capacitor typically comprises (1) a polysilicon capacitor plate, (2) an inversion region on the semiconductor (e.g., silicon) surface under the capacitor plate, and (3) a dielectric (e.g., silicon dioxide) separating the capacitor plate and the inversion region.

In conventional one-transistor dynamic memory cells, the polysilicon capacitor plate is common to all memory cells in the device. A potential is applied to the capacitor plate sufficient to generate the inversion region in the capacitor areas. The inversion region in each memory cell is isolated from adjacent cells by the level of impurity doping in the silicon separating the cells and by field oxide underneath the capacitor plate.

Recent advances in the art of DRAMs have been directed to decreasing the size of the memory cell, in order to provide a higher packing density of cells, with concomitant increase in device operating speed. In one such development, the capacitor is formed by a trench to minimize the surface area required for the capacitor, yet provide the same capacitance (about 50 fF).

Such a cell, appropriately termed the Trench Capacitor cell (Corrugated Capacitor cell) was first proposed for megabit dynamic random access memories by Sunami et al, "A Corrugated Capacitor Cell for Megabit Dynamic MOS Memories", 1982 IEDM Technical Digest, pp. 806–808 (1982). At greater than 1 Megabit integration levels, where the feature size ranges from about 0.8 to 1 $\mu$m, leakage current between adjacent trench capacitors becomes a limiting factor for data retention.

In conventional approaches, lightly doped P− epitaxial substrates are used as starting material for N-well (or twin-well) CMOS processes in the periphery support circuitry. In order to suppress leakage, heavy core implants are used to obtain a P-well concentration of greater than $1 \times 10^{16}$ cm$^{-3}$, as described by Elahy et al, "Trench Capacitor Leakage in Mbit DRAMs", 1984 IEDM Technical Digest, pp. 248–251 (1984).

However, for 5 $\mu$m or deeper trenches, it is impractical to achieve this concentration uniformly over the entire trench depth by using a surface implant and drive. This sets up a restriction on achievable trench depth.

One method which solves the leakage problem incorporates a Substrate Plate Cell concept, as described by Sakamoto et al, "Buried Storage Electrode (BSE) Cell for Megabit DRAMs", 1985 IEDM Technical Digest, pp. 710–713, (1985) and Lu et al, "The SPT Cell—A New Substrate-Plate Trench Cell for DRAMs", 1985 IEDM Technical Digest, pp. 771–772 (1985). In this method, the storage node is the polysilicon (poly) plug inside the trench.

It is also conceivable to use boron side-wall doping to reduce punch-through between trenches. However, this is a complex process, and is not widely used in the industry.

As the memory cell above is shrunk to a smaller size, the trench capacitor storing the data must occupy less chip area but retain the same storage capacitance ($\approx 50$ fF). Thus, what is needed is a new scheme that allows for smaller, deeper and more closely spaced trench capacitors.

SUMMARY OF THE INVENTION

Accordingly, it is an object of the present invention to provide a structure permitting smaller, deeper and more closely spaced trench capacitors in DRAMs.

It is another object of the present invention to provide such a structure in which the deep, closely spaced trench capacitors retain the capacitance of present trench capacitors, yet retain charge isolation with respect to neighboring capacitors.

It is a further object of the present invention to provide a process for achieving such a structure.

It is yet another object of the present invention to provide a process for fabricating such closely spaced trench capacitors in DRAMs by a manufacturing process that is compatible with present CMOS processes.

Briefly, this invention is predicated on the desirability of making DRAMs using the trench or corrugated capacitor cell with a double well CMOS process. The double well process starts with a high resistivity P epitaxial layer on a P+ substrate. N- and p-type dopants are then diffused into N- and P-wells, respectively. This allows independent control of the doping levels of each well for optimized transistors. The P+ substrate is used for latch-up protection.

The double well concept and the P-epi on P+ substrate are commonly used in modern CMOS processes. The trench capacitor is located in the P-well and extends down into the P epitaxial layer by several micrometers. In megabit generation memories, the trench depth is on the order of 4 $\mu$m, which is within the different P-well. It is important that the trench capacitor be confined inside the moderately doped P-well in order that the capacitors be electrically isolated.

For the smaller cells of future DRAMs, the trench capacitor must be made deeper to store approximately the same signal. In these cells, it is likely that the trench depth will exceed the P-well depth and extend into the substrate. These cells will experience inter-cell leakage and cross-talk because of the light doping. Driving the P-well deeper would involve prohibitively long furnace drive cycles. Using shallower P-epi layers would involve etching the trench into the out-diffused P+ substrate. Here, the doping concentration is so high that no inversion layer would form on the trench sidewall, and no charge storage would occur in the bottom portion of the trench.

In this invention, a double layer epitaxial structure is provided to impart a controlled uniform doping concentration over the entire trench depth. This approach allows trench depths that are not limited due to electrical leakage. Doping a portion in the upper epi layer to the same level as that of the lower epi layer and diffusing the dopants from the top of the upper epi layer and the bottom of the upper epi layer (from the top of the lower epi layer) provides a substantially uniform doping profile along the upper epi layer. This substantially uniform doping profile will support an unlimited trench depth, depending only on the thickness of the lower epi layer.

Alternatively, the substrate itself could be doped to the same extent as the lower epi layer, which could then be eliminated, thereby providing a single epi process. While the process would be simplified, the cell would not have the latch-up prevention properties provided by the P+ substrate.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

While the description which follows is directed to forming memory cells in p-doped silicon substrates, it will be appreciated that common variations of silicon processing technology may be employed, as well as that of other semiconductor materials. Also, n-doped substrates, with appropriate changes in conductivity type of other regions, may also be employed in the practice of the invention.

Figure 1:
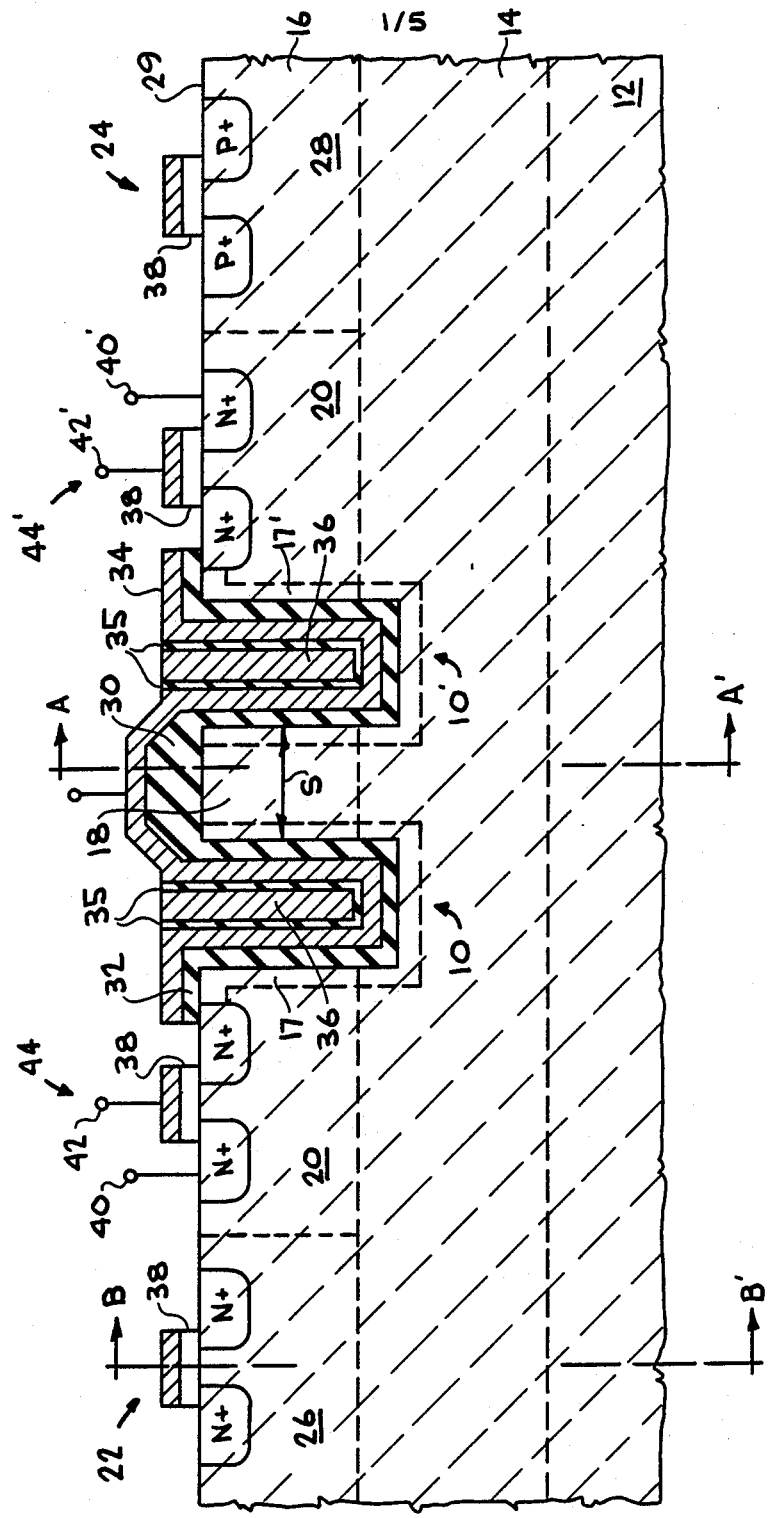
FIG. 1 is a simplified cross-section of portions of two memory cells, each including a trench capacitor, formed on a double epitaxial structure in accordance with the invention, as well as N- and P-channel peripheral devices.

A cross-section of the trench structure, depicted generally at 10, 10' and using a double epitaxial configuration in accordance with the invention, is shown in FIG. 1. The trench capacitor 10, 10' is formed on a semiconductor substrate 12, which typically comprises silicon. In the preferred embodiment, the substrate is doped with a p-type dopant to a level of about $10^{19}$ cm$^{-3}$ to minimize latch-up problems.

A first, or bottom, epi layer 14 is formed on the substrate 12 employing processes well-known in this art. The first epi layer 14 is formed to a thickness in the range of about 5 to 30 μm and doped with a dopant of the same conductivity type as the substrate to a concentration of about $5 \times 10^{15}$ to $1 \times 10^{17}$ cm$^{-3}$ to provide a resistivity of about 3 to 0.15 Ω-cm, with the higher concentrations associated with lower resistivity. This concentration level is to isolate the trench capacitors 10, 10' from each other, with higher doping levels associated with narrower spacing.

As an example, the bottom epi layer 14 may be 19 μm thick, doped with a p-type dopant to a concentration of $2 \times 10^{16}$ cm$^{-3}$ to achieve a resistivity of 0.75 Ω-cm. However, only part of the 19 μm is required for the trench depth. Considerable ($\approx 10$ μm) p-diffusion occurs during the well drive cycle (described below) such that the usable thickness of the bottom epi layer 14 is only about 9 μm.

A second, or upper, epi layer 16 is formed on the first epi layer 14, again employing processes well-known in this art. The second epi layer 16 is formed to a thickness in the range of about 2 to 8 μm and doped with a dopant of the same conductivity type as the substrate to a concentration of about $5 \times 10^{14}$ to $5 \times 10^{15}$ cm$^{-3}$ to provide a resistivity of about 40 to 3 Ω-cm.

If the second epi layer 16 is too shallow, out-diffusion from the lower epi layer could reach the surface and adversely affect doping of the wells of the peripheral transistors. On the ther hand, if the second epi layer 16 is too thick, then it will be too difficult to dope the layer from both sides to achieve the desired substantially uniform doping profile.

As an example, the upper epi layer 16 may be 5 μm thick, doped with a p-type dopant to a concentration of $1 \times 10^{15}$ cm$^{-3}$ to achieve a resistivity of 20 Ω-cm. Advantageously, the second epi 16 is formed in situ immediately after formation of the first epi 14.

Figure 1A:
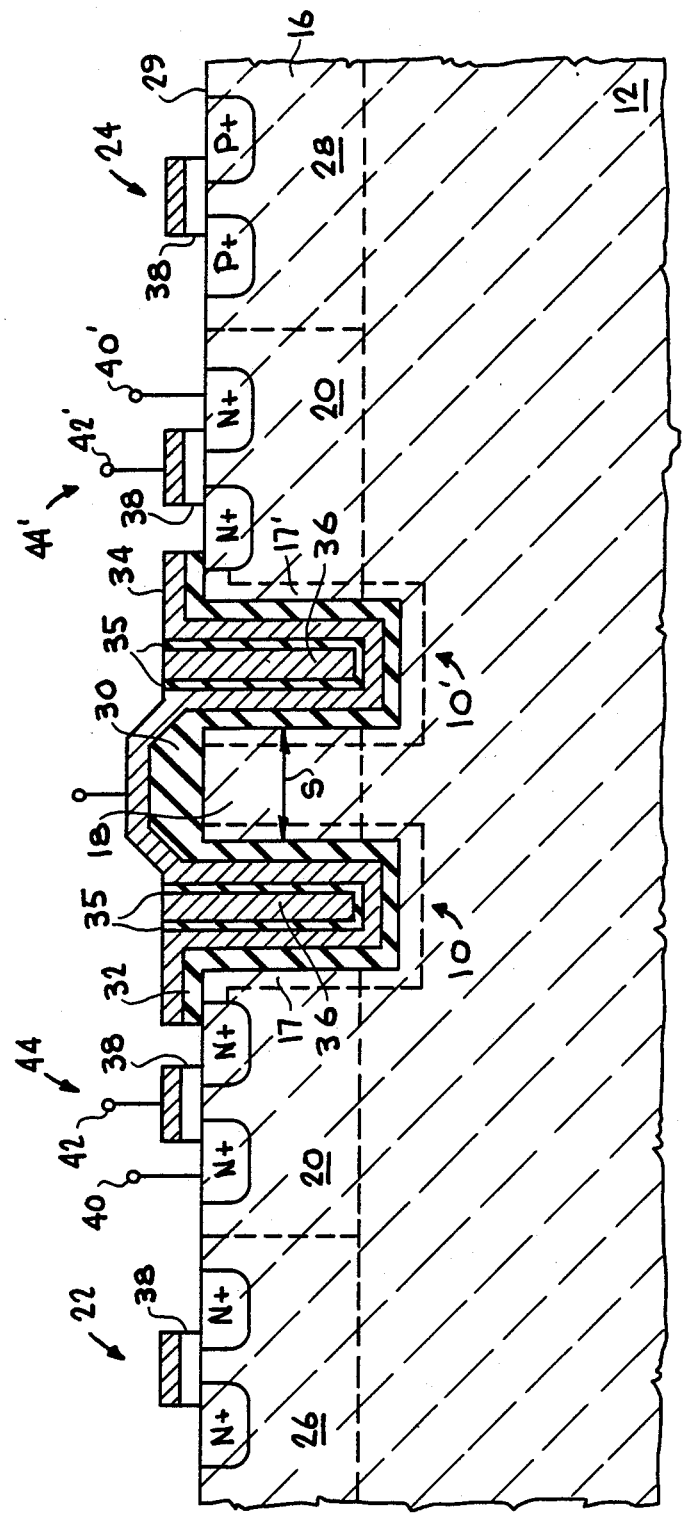
FIG. 1a is a view similar to that of FIG. 1, showing the devices of FIG. 1 formed on a single epitaxial structure in accordance with another embodiment of the invention.

Alternatively, as depicted in FIG. 1a, the bottom epi layer 14 may be eliminated, and the substrate 12 itself doped to the same range as indicated above for the bottom epi layer. While such an approach reduces the necessity of forming two epitaxial layers, and is contemplated by the invention, its use is limited to those instances where latch-up prevention is not a consideration. As used herein, the bottom epi layer 14 refers both to the actual layer and to the use of an appropriately-doped substrate.

The lower resistivity bottom epi layer 14 is used to isolate deep trench capacitors 10, 10'. Its greater thickness permits formation of deep (>5 μm) trench capacitors. Its doping concentration to prevent the onset of leakage between trench capacitors is conveniently determined from two-dimensional GEMINI computer simulations. The GEMINI computer simulations are widely used in the semiconductor industry to predict device performance from various design constraints; the program is available from Technology Modeling Associates (Palo Alto, Calif.).

During operation, an inversion region 17, 17' is formed around each trench capacitor 10, 10', respectively. These inversion regions must be kept separated.

Figure 2:
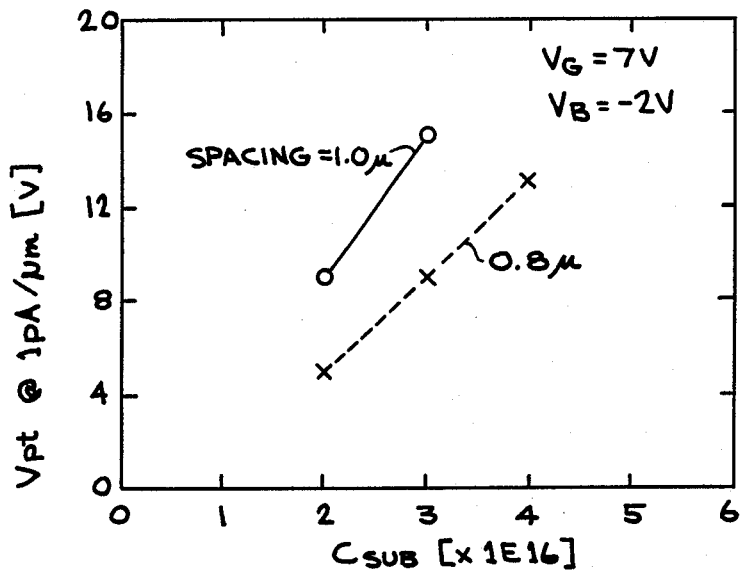
FIG. 2 is a plot on coordinates of voltage and dopant concentration, depicting the results of a two-dimensional computer simulation, showing punch-through voltage $V_{pt}$ as a function of substrate doping $C_{sub}$ at two different trench-to-trench spacings.

FIG. 2 shows simulated punch-through voltage ($V_{pt}$ measured at 1 pA/$\mu$m current) as a function of substrate concentration for trench spacings S of 1.0 $\mu$m and 0.8 $\mu$m on a structure that simulates the memory core of FIG. 1. The simulations were based on a uniform substrate doping ($C_{sub}$) and 8 $\mu$m deep trenches. At 1.0 $\mu$m spacing, a doping concentration of $2 \times 10^{16}$ cm$^{-3}$ is needed to control the leakage to less than 1 pA/$\mu$m for drain and capacitor plate biases of up to 7 volts.

The surface field doping, indicated at 18, is $6 \times 10^{16}$ cm$^{-3}$ in order to avoid surface leakage by the capcitor plate on a 0.4 $\mu$m thick field oxide 30. For other field oxide thicknesses, the doping can be adjusted as appropriate, employing techniques well-known in the art.

It should be noted that the 2-D simulations presented are worst case conditions. In an actual cell, the punch-through should be further suppressed by the 3-D effect of the substrate bias.

Figure 3:
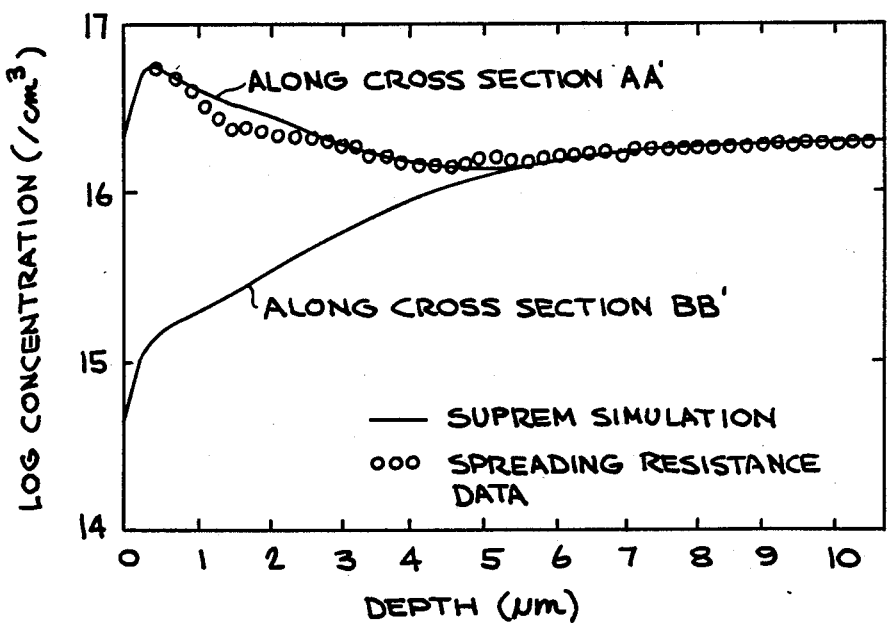
FIG. 3 is a plot on coordinates of dopant concentration and distance, depicting actual results and a computer simulation of doping concentration as a function of depth along cross-sections taken along the lines A-A' and B-B' of FIG. 1, with the profile B-B' being of the P-well areas prior to the well doping processing step.

The upper epi layer 16 is the substrate for the fabrication of peripheral CMOS devices 22, 24. The upper layer 16 is selectively implanted with boron and thermally driven to a concentration of about $2 \times 10^{16}$ cm$^{-3}$ in the core region 20. The thickness of this top epi layer 16 is chosen such that, after the complete process, out-diffusion from the bottom epi 14 will not reach the surface. In the core region 20, however, the core implant diffuses toward and merges with the out-diffusion from the bottom epi layer 14 to achieve a nearly uniform concentration, here, about $2 \times 10^{16}$ cm$^{-3}$. FIG. 3 shows a plot of doping concentration versus depth from spreading resistance data, as well as SUPREM simulation results along cross-sections A-A' and B-B' of FIG. 1. As with the GEMINI program, the SUPREM program is widely used in the semiconductor industry and is available from the same source.

The A-A' profile was at the end of the process, while the B-B' profile was taken before the well-doping step. The concentration maximum near the surface along cross-section A-A' is due to the field implant.

At the same time the upper layer 16 is selectively implanted to form the P-well core region 20, the P- and N-wells 26 and 28, respectively, for the peripheral N- and P-channel transistors 22 and 24, respectively, are implanted with appropriate dopants. As is common, phosphorus is used for doping the N-wells, while boron is used for doping the P-wells. The doping levels and doping process are those conventionally employed in the art. The wells 26 and 28 are thermally driven to achieve the desired well depth and surface concentration.

Next, the active areas associated with the devices 10, 10', 22, 24, 44, 44' are defined using a local field oxidation process in which oxide (silicon dioxide) is grown on the bare silicon surface 29 to about 500 Å. This is followed by deposition of a layer of silicon nitride, which is formed to a thickness of about 1,000 Å.

The active areas are delineated by photoresist, and the silicon nitride is etched away from the inactive or field regions. Next, boron is implanted into the field regions, using the silicon nitride as a mask. A dose of about $10^{13}$ ions/cm$^2$ at 30 keV is sufficient to give a field doping concentration of about $5 \times 10^{16}$ cm$^{-3}$, which provides for surface isolation.

The structure is then oxidized to grow oxide in the field regions, such as shown at 30; oxide growth in the active regions is inhibited by the presence of the silicon nitride. After stripping the nitride, a layer of SiO$_2$ containing 10% phosphorus is deposited to a thickness of about 1 $\mu$m. This is followed by the trench capacitor mask that defines the trench capacitors 10, 10'. This mask is used to etch the deposited oxide and any underlying thermal oxide. After stripping the photoresist, the trenches are etched into the silicon substrate, using the deposited oxide as an etch mask. The etching is conveniently performed in a reactive ion etcher, using CCl$_4$ as the etch gas.

After the trenches are etched, the deposited masking oxide is removed in a weak aqueous HF solution. The deposited oxide etches considerably faster than the thermal oxide, as is well-known. The etching is terminated when the deposited oxide is completely etched away, leaving nearly all the field oxide 30, which is about 4,000 Å thick.

The capacitor dielectric 32, comprising silicon dioxide, is then grown on the active areas and on the exposed trench surfaces to a thickness of about 150 Å. This is followed by deposition of the polycrystalline silicon layer 34 to a thickness of about 2,000 Å. The polysilicon layer is then doped with phosphorus and becomes the capacitor plate 34.

Next, a layer of oxide 35 is grown on the polysilicon capacitor plate. This is followed by deposition of a second layer 36 of polysilicon, which completely fills the trench. Using the reactive ion etcher, the second layer of polysilicon is partially removed from the top surface but not from the interior of the trench. The thermal oxide prevents etching of the capacitor plate.

If a double polyprocess is employed, a second layer of thermal oxide is then grown over the capacitor plate 34 and the remaining second polysilicon layer. Masking steps that define the capacitor plate 34 are employed. The etching requires etching the thermal oxide in HF followed by etching the doped polysilicon capacitor plate in a reactive ion etcher. Etching must be terminated such that the capacitor dielectric is not completely etched. This prevents any substrate silicon from being etched.

Then, the exposed capacitor dielectric is etched in HF and the gate oxides 38 (about 250 Å thick) for the transistors, e.g., 22, 24, 44, 44', are grown.

The remaining process comprises conventional silicon gate CMOS processing.

The portion of the device shown in FIGS. 1 and 1a also includes pass-gate transistors 44, 44', connected to bit lines 40, 40' and word lines 42, 42', respectively, as illustrated and as is conventional. The pass-gate transistors 44, 44' are also cooperatively associated with the trench capacitor device 10, 10'.

Three cases described in Table I below were investigated. The first case used the double-epi process described above. The second and third cases used 20 $\Omega$-cm, 19 $\mu$m thick single epi wafers. Core implants for the first two cases were the same; the dose was reduced in the third case.

Wafers from all three cases were then recombined and thermally driven-in under the same well drive cycle. The resulting peak concentration was $2 \times 10^{16}$ cm$^{-3}$ for the first two cases and $5 \times 10^{15}$ cm$^{-3}$ for the third case. Active areas were defined by a mask to generate test structures with 1.0 $\mu$m resolution. Punch-through test structures consisted of two sets of trenches (25 trenches per side measuring $1.4 \times 1.6$ $\mu$m etch) at various spacings (S) as shown in FIG. 1.

Following a field implant and oxidation of 5,000 Å, 5.5 μm deep trenches were etched to form capacitors with spacings (S) down to 1.0 μm. A double poly trench capacitor process was used to complete the processing.

TABLE I

| Case | Single or Double-epi | Concentrations, cm$^{-3}$ | | |
|---|---|---|---|---|
| | | Bottom Epi | Top Epi | Core Well |
| 1 | double | $2 \times 10^{16}$ | $5 \times 10^{14}$ | $2 \times 10^{16}$ |
| 2 | single | — | $5 \times 10^{14}$ | $2 \times 10^{16}$ |
| 3 | single | — | $5 \times 10^{14}$ | $5 \times 10^{15}$ |

Punch-through currents between a trench and an adjacent N+ diffusion as well as between adjacent trenches were measured for all three cases. Punch-through current between the trench and the adjacent N+ surface diffusion is mainly determined by the field doping profile near the surface. No appreciable leakage current was observed among the three cases down to 1.0 μm spacing.

Figure 4:
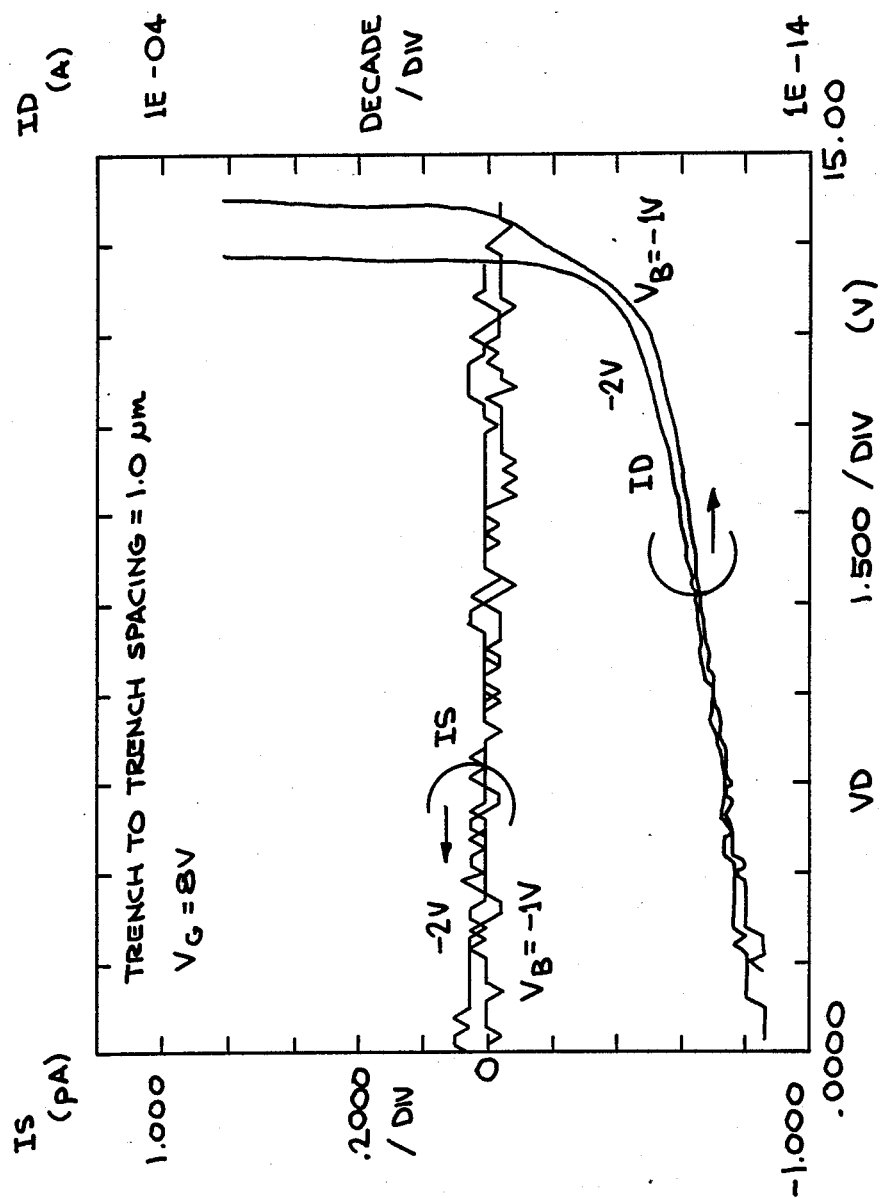
FIG. 4 is a plot on coordinates of current and voltage, depicting I-V characteristics between adjacent trenches spaced at 1.0 μm, showing drain current $I_D$ and punch-through current $I_S$ as a function of applied voltage.
Figure 5A:
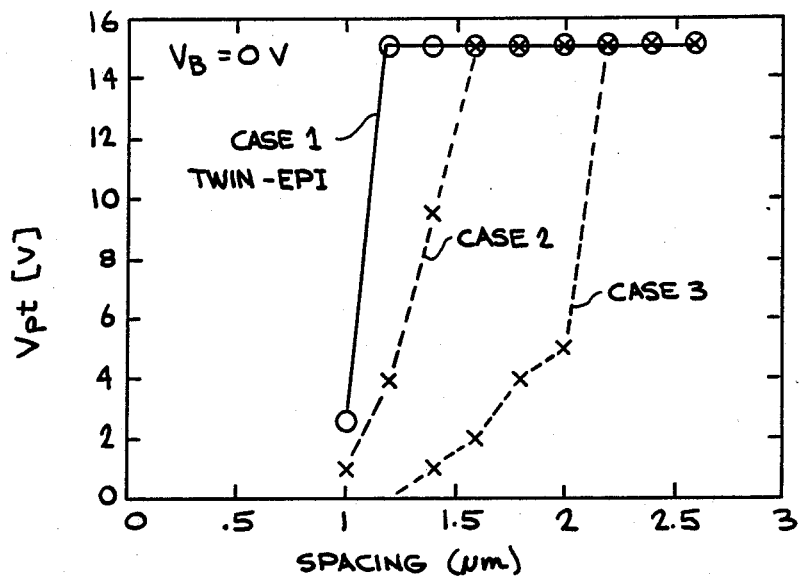
FIGS. 5a and 5b are plots on coordinates of voltage and distance, depicting punch-through voltage as a function of trench spacing for several cases at (a) zero back bias and (b) −1 volt substrate bias.
Figure 5B:
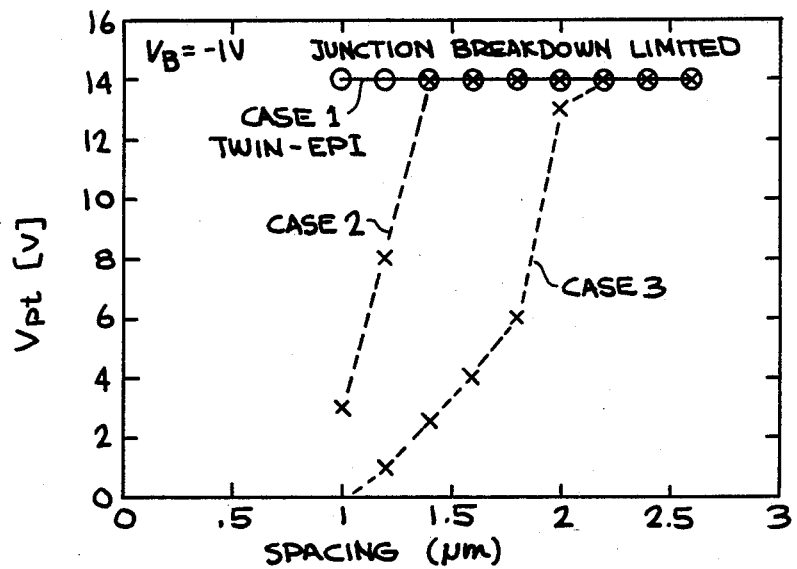

On the other hand, leakage between trenches was strongly influenced by the doping profile between the trenches. $I_D$ (which consists of junction leakage and punch-through current) and $I_S$ (which is primarily punch-through current) were measured at room temperature as a function of drain bias with 8 volts on the capacitor plate. The results for the double-epi process and 1.0 μm trench spacing are shown in FIG. 4. To the sensitivity limit of 0.1 pA, no punch-through current ($I_S$) was observed up to junction breakdown at either −1 or −2 volts of substrate bias. The device with 1.0 μm spacing starts to punch-through at zero substrate bias, while trenches with 1.2 μm spacing showed no punch-through even under zero back bias at this same doping level. Plots of punch-through voltage (at 1 pA current) versus trench spacing are shown in FIG. 5a and 5b for all three cases at zero and −1 volt back bias, respectively. For a back bias of −1 V, the impact of the double-epi process of the invention cannot be fully appreciated due to the limitation of the lithography at 1.0 μm. However, it is clear that the single epi process (case 2) would require a trench spacing of 1.4 μm. Lightly doped case 3 punches through rather easily at a 2 μm spacing. No enhanced gated-diode leakage was observed in the double-epi process of the invention compared with the single epi process.

Pass-gate transistors at 1.0 μm channel length on mask are also functional at this doping concentration of $2 \times 10^{16}$ cm$^{-3}$. The improvement obtained by the double-epi process of the invention should be even more pronounced for deeper trenches in higher density memories when the conventional well doping does not penetrate to the bottom of the trench.

Thus, a deep trench capacitor isolation at 1.0 μm spacing has been shown by using a double-epi structure compatible with conventional CMOS processes. With the structure of the invention, trench depth is no longer a limit to further scaling of DRAMs to 4 megabit and greater levels.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. In a dynamic random access memory device including at least one of P-channel and N-channel periphery support circuitry (22, 24) and a memory core (20) comprising a plurality of trench capacitors (10, 10') formed in a semiconductor region, pairs of said capacitors being separated by a minimum distance (S), with said capacitors employing a common capacitor plate (34) and further storing charge in portions (17, 17') of said region adjacent said capacitors, said region comprising (a) a first epitaxial layer (14) formed on a substrate (12), said epitaxial layer having the same conductivity type as that of said substrate and having a resistivity higher than that of said substrate, and (b) a second epitaxial layer (16) formed on said first epitaxial layer, said second epitaxial layer having the same conductivity type as said first epitaxial layer and said substrate and having a resistivity higher than that of said first layer, said device formed on the top surface of said second epitaxial layer and said trench capacitors extending through said second epitaxial layer into said first epitaxial layer to thereby isolate said portions of said trench capacitor having a distance of less than about 2 μm, with said core having a substantially uniform doping profile.

2. The memory device of claim 1 wherein said semiconductor comprises silicon.

3. The memory device of claim 1 wherein said substrate (12), said first layer (14) and said second layer (16) are all of p-type conductivity.

4. The memory device of claim 1 wherein said first layer (14) has a resistivity ranging from about 0.15 to 3 Ω-cm and said second layer (16) has a resistivity ranging from about 3 to 40 Ω-cm.

5. The memory device of claim 4 wherein said first layer (14) has a resistivity of about 0.75 Ω-cm and said second layer (16) has a resistivity of about 20 Ω-cm.

6. The memory device of claim 1 wherein said first layer (14) has a thickness ranging from about 5 to 30 μm and said second layer (16) has a thickness ranging from about 2 to 8 μm.

7. The memory device of claim 6 wherein said first layer (14) has a thickness of about 19 μm and said second layer (16) has a thickness of about 5 μm.

8. An improved configuration for isolating trench capacitors (10, 10') extending more than about 5 μm into a semiconductor region and spaced (S) less than about 1 μm from adjacent trench capacitors, wherein said region comprises a relatively thin, lightly doped upper epitaxial layer (16) on top of a thicker and more heavily doped lower epitaxial layer (14) in turn formed on top of a substrate (12), said upper epitaxial layer having a higher resistivity than said lower epitaxial layer and said lower epitaxial layer having a higher resistivity than said substrate, with said adjacent capacitors surrounded by a core region (20) having a substantially uniform doping profile.

9. The configuration of claim 8 wherein said semiconductor comprises silicon.

10. The configuration of claim 8 wherein said substrate (12), said first layer (14) and said second layer (16) are all of p-type conductivity.

11. The configuration of claim 8 wherein said lower layer (12 or 14) has a resistivity ranging from about 0.15 to 3 $\Omega$-cm and said upper layer (16) has a resistivity ranging from about 3 to 40 $\Omega$-cm.

12. The configuration of claim 11 wherein said lower layer (12 or 14) has a resistivity of about 0.75 $\Omega$-cm and said upper layer (16) has a resistivity of about 20 $\Omega$-cm.

13. The configuration of claim 8 wherein said lower layer (12 or 14) has a thickness ranging from about 5 to 30 $\mu$m and said upper layer (16) has a thickness ranging from about 2 to 8 $\mu$m.

14. The configuration of claim 13 wherein said lower layer (12 or 14) has a thickness of about 19 $\mu$m and said upper layer (16) has a thickness of about 5 $\mu$m.

* * * * *